United States Patent
Wang et al.

(10) Patent No.: US 8,197,908 B2
(45) Date of Patent: Jun. 12, 2012

(54) METHOD FOR PREPARING ELECTRICALLY CONDUCTING MATERIALS

(75) Inventors: Hai Wang, Arcadia, CA (US); Denis Phares, Pasadena, CA (US)

(73) Assignee: Hestia Tec, LLC, Pasadena, CA (US)

( * ) Notice: Subject to any disclaimer, the term of this patent is extended or adjusted under 35 U.S.C. 154(b) by 781 days.

(21) Appl. No.: 12/076,196

(22) Filed: Mar. 14, 2008

(65) Prior Publication Data

US 2009/0233000 A1    Sep. 17, 2009

(51) Int. Cl.
    *C23C 4/10*    (2006.01)
(52) U.S. Cl. ............... 427/446; 427/453; 427/255.31
(58) Field of Classification Search ............ 427/446, 427/453, 255.31
    See application file for complete search history.

(56) References Cited

U.S. PATENT DOCUMENTS

| | | | |
|---|---|---|---|
| 4,970,196 A | 11/1990 | Kim et al. | |
| 5,458,753 A * | 10/1995 | Sato et al. | 204/192.29 |
| 5,487,918 A * | 1/1996 | Akhtar | 427/255.31 |
| 5,603,983 A * | 2/1997 | Clough et al. | 427/126.3 |
| 5,628,933 A | 5/1997 | Carter et al. | |
| 5,840,373 A | 11/1998 | Hahn et al. | |
| 5,951,768 A * | 9/1999 | Hahn et al. | 118/715 |
| 6,013,318 A | 1/2000 | Hunt et al. | |
| 6,086,962 A * | 7/2000 | Mahoney et al. | 427/577 |
| 6,242,049 B1 * | 6/2001 | McCarty et al. | 427/446 |
| 6,458,673 B1 | 10/2002 | Cheung et al. | |
| 6,645,843 B2 | 11/2003 | Kim et al. | |
| 6,777,374 B2 | 8/2004 | Sahle-Demessie et al. | |
| 6,818,924 B2 | 11/2004 | Kim et al. | |
| 6,917,158 B2 | 7/2005 | Lee et al. | |
| 6,998,156 B2 | 2/2006 | Bubb et al. | |
| 7,309,405 B2 | 12/2007 | Cho et al. | |
| 2003/0035906 A1 * | 2/2003 | Memarian et al. | 428/1.3 |
| 2004/0232506 A1 * | 11/2004 | Kojima et al. | 257/431 |
| 2006/0249714 A1 * | 11/2006 | Hiroshige et al. | 252/511 |
| 2007/0098435 A1 * | 5/2007 | Kitagawa et al. | 399/100 |
| 2007/0111450 A1 * | 5/2007 | Sato et al. | 438/264 |
| 2009/0220702 A1 | 9/2009 | Wang et al. | |

FOREIGN PATENT DOCUMENTS

| | | |
|---|---|---|
| EP | 1443271 A1 | 8/2004 |
| JP | 61-205619 A | 11/1986 |
| JP | 03-072011 B2 | 11/1991 |
| KR | 1020070068216 A | 6/2007 |
| RU | 2157485 C1 | 10/2000 |

OTHER PUBLICATIONS

Zhao, Bin, et al., "Ultrafine anatase $TiO_2$ nanoparticles produced in premixed ethylene stagnation flame at 1 atm". Proceedings of the Combustion Institute 30 (2005) pp. 2569-2576.*

(Continued)

*Primary Examiner* — Bret Chen
(74) *Attorney, Agent, or Firm* — McDermott Will & Emery LLP

(57) ABSTRACT

Processes for depositing conductive materials on substrates are disclosed which include the steps of combusting a premixed fuel and oxidant to form a stagnation flame against a moving surface which stabilizes the stagnation flame and introducing at least one precursor to the flame to form a conducting material onto the substrate.

20 Claims, 5 Drawing Sheets is a schematic illustration of premixed, stagnation flame.

OTHER PUBLICATIONS

Madler, L., et al., "Direct formation of highly porous gas-sensing films by in situ thermophoretic deposition of flame-made Pt/SnO2 nanoparticles". Sensors and Actuators B 114 (2006) pp. 283-295.*

Zhao, Bin, et al., "Ultrafine anatase TiO2 nanoparticles produced in premixed ethylene stagnation flame at 1 atm". Proceedings of the Combustion Institute 30 (2005) 2569-2576.*

Madler, L., et al., "Direct formation of highly porous gas-sensing films by in situ thermophoretic deposition of flame-made Pt/SnO2 nanoparticles". Sensors and Actuators B 114 (2006) 283-295.*

Meier, W., et al., "The Application of Single-Pulse CARS for Temperature Measurements in a Turbulent Stagnation Flame." Appl. Phys. B. 53, 339-346 (1991).*

Kavitha et al., "Oxide films by combustion pyrolysis of solution precursors", Materials Science and Engineering, 2003, A359, 18-23.

Mädler et al., "Direct formation of highly porous gas-sensing films by in situ thermophoretic deposition of flame-made Pt/SnO2 nanoparticles", Sensors and Actuators, 2006, B114, 283-295.

McCormick et al., "Thermal stability of flame synthesized anatase $TiO_2$ nanoparticles", J. Phys. Chem. B, 2004, 108, 17398-17402.

Zhao et al., "Transparent Conducting ZnO:Al Films via CCVD for Amorphous Silicon Solar Cells", preprint of poster 4P2.11 presented at 29th IEEE PVSC New Orleans, May 20-24, 2002.

Zhao et al., "Ultrafine anatase $TiO_2$ nanoparticles produced in premixed ethylene stagnation flame at 1 atm.", Proc. Combustion Institute, 2005, 30, 2569-2576.

Egerton et al., "Flame Propagation: the measurement of burning velocities of slow flames and the determination of limits of combustion", Proceedings of The Royal Society A, 1952, 211, 445-471.

Hu et al., "Textured aluminum-doped zinc oxide thin-films from atmospheric-pressure chemical-vapor deposition", J. of App. Phys., 1992, 71, 880-890.

Kaid et al., "Preparation of ZnO-doped Al by spray pyrolysis technique", Applied Surface Science, 2007, 253, 3029-3033.

Minami et al., "Highly conductive and transparent ZnO thin films prepared by RF magnetron sputtering in an applied external DC magnetic-field", Japanese J. Applied Phys., 1984, 23, L280-L282.

Tolmachoff et al., "Flame synthesis of nanophase TiO2 crystalline films", 5th US Combustion meeting, Mar. 25-28, 2007, paper No. H15, pp. 1-9.

Zhao et al., "A Comparative Study of Nanoparticles in Premixed Flames by Scanning Mobility Particle Sizer, Small Angle Neutron Scattering, and Transmission Electron Microscopy", Proc. Combustion Institute, 2007, 31, 851-860.

Islam, et al., XPS and X-ray Diffraction Studies of Aluminum-Doped Zinc Oxide Transparent Conducting Films, Thin Solid Films 280 (1996) 20-25.

Hu, et al., Textured aluminum-doped zinc oxide thin films from atmospheric pressure chemical-vapor deposition, J. Appl. Phys, 71 (2), Jan. 15, 1992, 880-890.

Law, Combustion Physics, 2006, chapter 10, pp. 396-473, Cambridge University Press, NY, USA.

Skandan et al., Low-pressure flame deposition of nanostructured oxide films, J. Am. Ceram. Soc., (1998) 81[10] 2753-56.

Zhao et al., Control of nanoparticle size and agglomeration through electric-field-enhanced flame synthesis, J. Nanopart. Res. (2008) 10:907-923.

International Search Report, mailed Nov. 30, 2009 in PCT US/2009/ 037282.

* cited by examiner

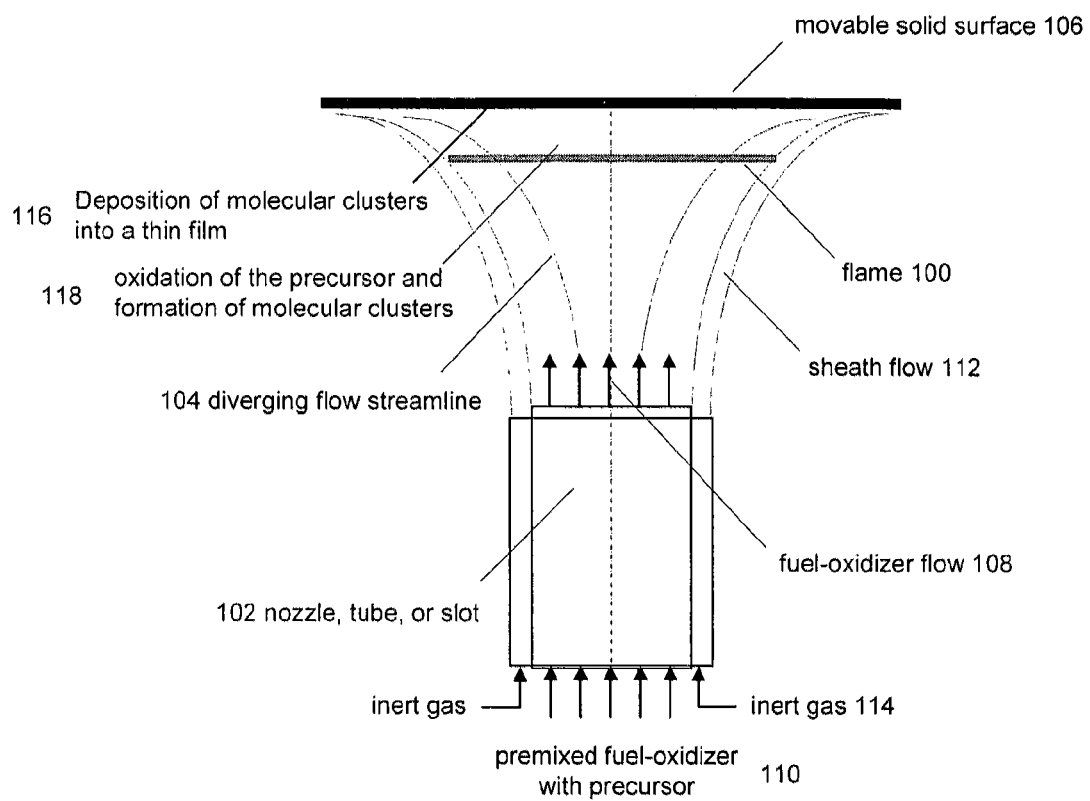
FIG 1 is a schematic illustration of premixed, stagnation flame.

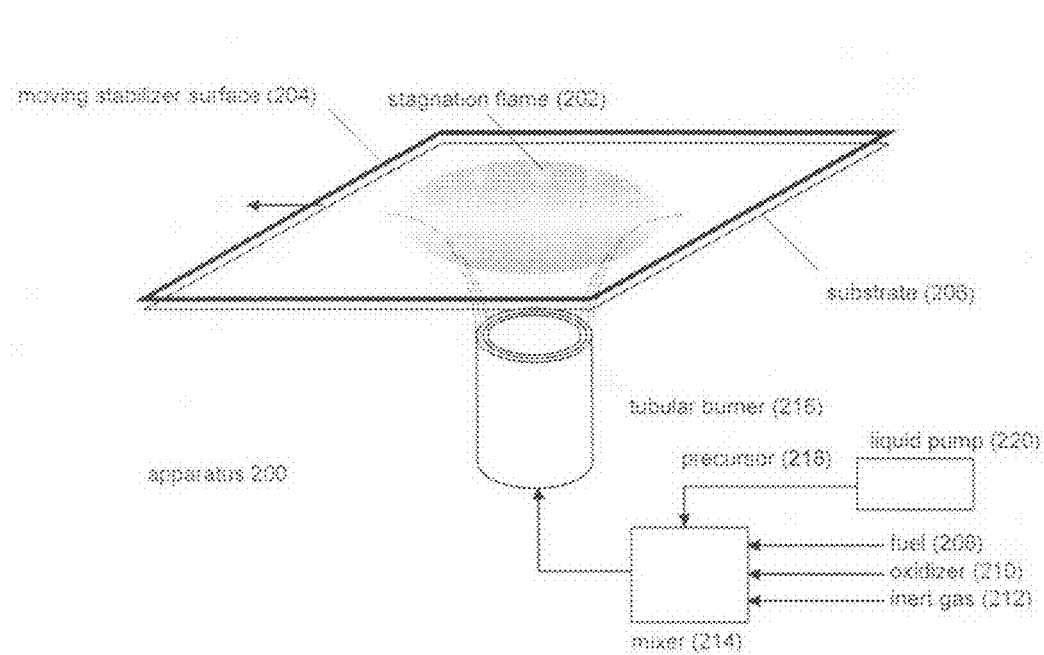
FIG 2 is a schematic illustration of apparatus using a tubular burner illustrating a set-up that can be used to form conducting materials on a substrate

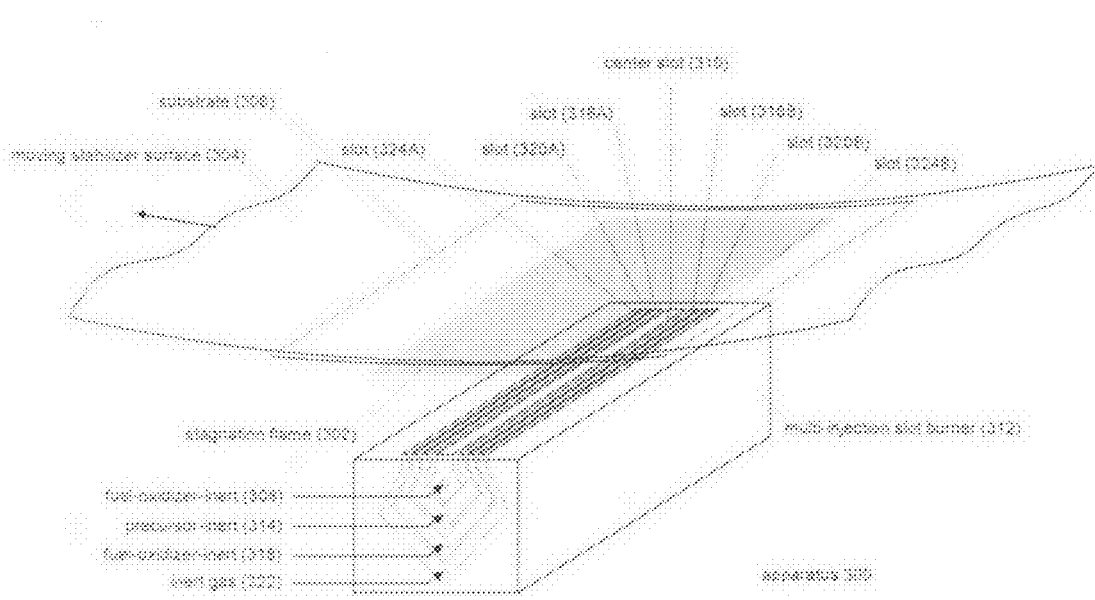
FIG 3 is a schematic illustration of apparatus using a multi-injection slot burner illustrating a set-up that can be used to form conducting materials on a substrate.

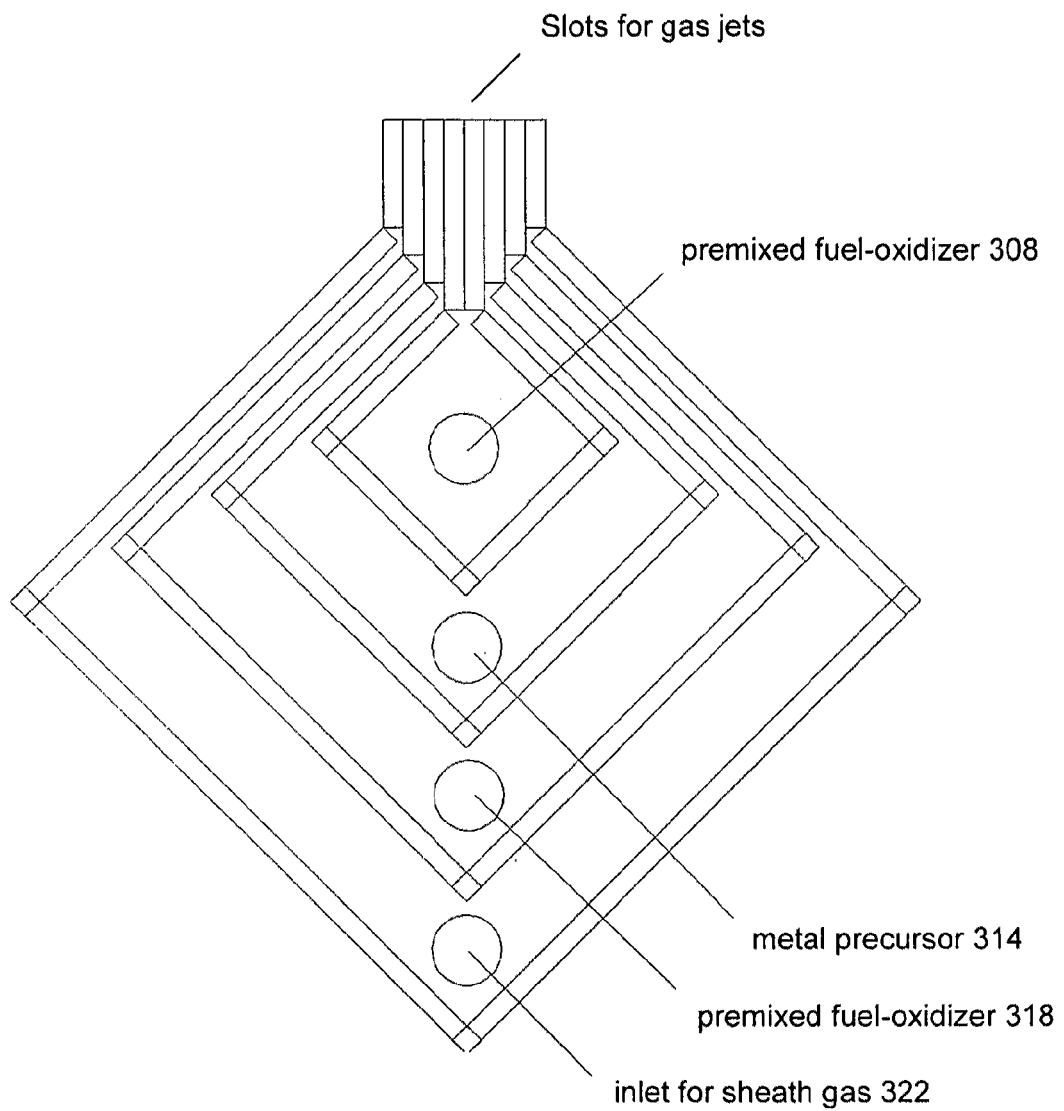
Fig. 4 is a schematic illustration for a multi-injection slot burner.

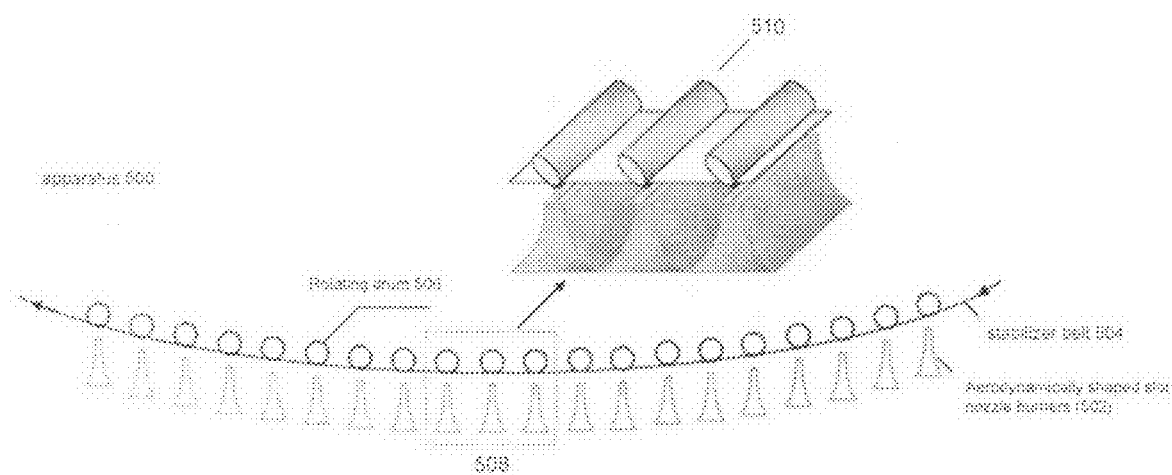
Fig. 5 is a schematic illustrating a set-up using an array of burners that can be used to form conducting materials on a substrate.

METHOD FOR PREPARING ELECTRICALLY CONDUCTING MATERIALS

TECHNICAL FIELD

The present disclosure relates to processes for forming conducting materials, such as transparent conducting oxides, on substrates and the use of such materials in devices.

BACKGROUND

Conducting materials such as superconducting materials and transparent conducting materials have a wide range of applications. For example, transparent conducting oxide (TCO) films are useful for optical display devices such as cell phones, personal digital assistants, flat panel displays, plasma screens, computers, and various touch panel devices, e.g., ATM machines. TCOs are also used in photovoltaics, such as thin-film solar cells, liquid crystal displays, light-emitting diodes, and as antistatic and antifogging coatings and EMI shieldings.

Several methods of depositing films on substrates are known, including sputtering techniques, chemical vapor deposition (CVD), spray pyrolysis, combustion chemical vapor deposition (CCVD), and pulsed laser deposition. In some instances, the films that are produced by these methods are conducting and/or transparent.

The most commonly employed technique to deposit crystalline thin films onto a cool substrate is sputtering. Although different films require different sputtering conditions, a variety of techniques for depositing transparent conductive oxides, including Tin-doped Indium Oxide (ITO) and Aluminum-doped Zinc Oxide (AZO or ZnO:Al), have been disclosed. See, for example, U.S. Pat. Nos. 7,309,405; 5,458,753; Japanese Examined Patent Publication No. 72011/1991; Minami, Nanto, & Takata "Highly conductive and transparent ZnO thin films prepared by RF magnetron sputtering in an applied external DC magnetic-field", Thin Solid Films, 1985, 124, 43-47. However, the technique of sputter-coating a substrate almost universally requires a sealed vacuum chamber and as such is implemented as a batch process. It is therefore not conducive to large-scale production.

CVD methods also typically require a low-pressure or sealed chamber, thus making these techniques less favorable for large scale production of thin films. However, Hu & Gordon reported producing AZO films under atmospheric-pressure vapor deposition of a heated mixture of diethyl zinc, triethyl aluminum, and ethanol. Hu & Gordon, "Textured aluminum-doped zinc oxide thin-films from atmospheric-pressure chemical-vapor deposition" J. of App. Phys., 1992, 71, 880-890. Nevertheless, high substrate temperatures between 367° C. and 444° C. were recorded for satisfactory results. The high substrate temperatures are believed to allow surface rearrangement reactions to occur to promote reasonable crystallinity of the deposited film.

Spray pyrolysis and CCVD both involve the formation by combustion of the molecular precursors or molecular clusters to be deposited into a crystalline film, and both techniques may be used at atmospheric pressures to form thin films. Both, however, typically require substrate temperatures of roughly 450° C. Kaid & Ashour ("Preparation of ZnO-doped Al by spray pyrolysis technique", Applied Surface Science, 2007, 253, 3029-3033) demonstrate the fabrication of AZO film by spray pyrolysis of ammonium nitrate and zinc acetate onto a stationary substrate heated to an optimal temperature of 450° C. U.S. Pat. No. 6,013,318 discloses the application of CCVD to the fabrication of thin-films, whereby combustion of a fuel, oxidizer, and precursor gases or liquids results in vapor-phase compounds which deposit onto a nearby substrate. This disclosure relates to diffusion flames, i.e., flames that are formed when a fuel and oxidizer are injected separately and meet at about the flame front. Further, Zhao et al ("Transparent Conducting ZnO:Al Films via CCVD for Amorphous Silicon Solar Cells", preprint, $29^{th}$ IEEE PVSC, New Orleans, May 2002) disclosed an open-air CCVD process in which ZnO:Al films were deposited onto hot borosilicate glass substrates over a flame. The metal precursors were delivered into the flame by a flow of oxygen.

Another disclosed technique aimed at keeping the substrate cool during deposition is pulsed laser deposition (U.S. Pat. No. 6,818,924), whereby a substrate is placed in the vicinity of a bulk material, which is subsequently irradiated with a pulsed laser. Material is evaporated from the target onto the substrate, keeping the substrate cool. This technique resembles sputtering, in that material to be deposited needs to be evaporated in a reduced atmosphere.

Processes for preparing particle coatings, i.e., titanium dioxide particle coatings, by a stagnation flame have been reported (see, for example, McCormick et al., "Thermal Stability of Flame Synthesized Anatase $TiO_2$ Nanoparticles", J. Phys. Chem. B, 2004, 108, 17398-17402; and Zhao et al., "Ultrafine Anatase $TiO_2$ Nanoparticles Produced in Premixed Ethylene Stagnation Flame at 1 Atmosphere", Proc. Combustion Institute, 2005, 30, 2569-2576). These articles describe forming a stagnation flame a short distance below a stationary, stabilizing plate and collecting titanium dioxide particles on to a substrate that is translated into and out of the flame. These articles do not disclose producing a stagnation flame against a mobile stabilizing plate.

Despite the disclosure of forming conducting materials on substrates, it is desirable to provide a process that can form conducting materials on moving substrates to improve throughput and manufacturing yield. It is further desirable to provide processes that can form conducting materials on substrates in a continuous process under mild conditions and low substrate temperatures.

SUMMARY OF THE DISCLOSURE

An advantage of the present disclosure is methods of forming conducting materials on substrates. Advantageously, the methods of the present disclosure can form conducting materials on substrates in a continuous process with low substrate temperatures although they are not limited thereto.

These and other advantages are satisfied, at least in part, by a process of forming a conducting material, e.g., a transparent conducting oxide, on a substrate. The process comprises combusting a premixed fuel and oxidant to form a stagnation flame against a moving article or substrate to stabilize the stagnation flame, and introducing at least one precursor to the flame to form a conducting material onto the substrate.

Embodiments of the present disclosure include combusting a premixed fuel/oxidant, e.g., a premixed hydrocarbon/oxygen, to form one or more stagnation flames through one or more burners and moving a substrate against the one or more flames to form/stabilize the one or more flames at a short distance from the substrate. The substrate can be held by a moving article which allows the substrate to repeatedly move against the flame to deposit the conducting material on the substrate. Precursor are introduced to the one or more stagnation flames to form a conducting material on the substrate.

Additional embodiments include directing the fuel and oxidant through a burner having more than one nozzle and directing the precursor through a different nozzle of the burner.

In an aspect of the present disclosure, the process comprises forming a transparent conducting oxide (TCO) on a substrate by combusting a premixed fuel and oxidant to form a stagnation flame against a moving substrate or article to stabilize the stagnation flame, and introducing at least one TCO forming precursor, e.g. an aluminum, tin, zinc and/or indium based precursor, to the flame to form the TCO on the substrate. Embodiments include forming an aluminum doped zinc oxide and/or indium tin oxide TCO.

Another aspect of the present disclosure are devices such as optoelectronic devices, including a substrate having conducting material produced by a stagnation flame.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent similar elements throughout and wherein:

FIG. 1 is a schematic illustration of a burner set-up that can be used to form conducting materials on a substrate using a stagnation flame.

FIG. 2 is a schematic illustration of a burner set-up that can be used to form conducting materials on a substrate using a round, premixed stagnation flame.

FIG. 3 is a schematic illustration of a multi-injection, slot burner set-up that can be used to form conducting materials on a substrate using a rectangular, premixed stagnation flame.

FIG. 4 is a schematic illustration of a side view of the multi-injection, slot burner of FIG. 3.

FIG. 5 is a schematic illustration of a burner set-up using an array of burners that can be used to form conducting materials and additional materials on a substrate.

DETAILED DESCRIPTION OF THE DISCLOSURE

The present disclosure is directed to the preparation of conducting materials on substrates. The conductive materials can be deposited on the substrate in the form of a coating or film or any other form. The conducting material is deposited onto the substrate by use of a stagnation flame. The stagnation flame can be established by the diversion of the flow of combusted gas exiting a burner and then stabilized into a thin flame sheet by flame stretch against a stabilizing surface. As used herein, the term 'against' in the context of stabilizing a stagnation flame means that the flame and stabilizing surface are at such a distance that the surface stabilizes the flame into a stagnation flame. Typically, the flame is at a short distance away from the surface but the term 'against' does not exclude or require the flame from contacting the stabilizing surface. The stabilizing surface can be a surface of an article or a surface of the substrate itself. Deposition of a conducting material is accomplished by introducing at least one precursor to the flame which is then heated, oxidized and/or otherwise transformed by the flame to form materials which are then deposited onto the surface of the substrate. It is believed that deposition of conducting material occurs by flow impingement, diffusion and/or thermophoresis of materials, which may be in the form of molecular clusters or nanoparticles, that are produced from the heated, oxidized and/or otherwise transformed precursor(s) exiting the flame on their way to the surface of the substrate.

Stagnation flames advantageously do not require a flame anchor. Hence, stagnation flames have also been referred to as stagnation point flames detached from any solid surface because flame stabilization is primarily through flow divergence and not conductive heat loss to the burner or substrate surface. They can be formed by premixing an oxidizer with a fuel and ejecting this flow through a burner prior to the combustible components reaching the flame front. If the local axial flow velocity is equal to the flame speed, a stationary flat flame front normal to the flow direction can be achieved. This condition creates a thin flame front since all of the reactants are readily available.

Unlike spray or diffusion flames, stagnation flames advantageously have high uniformity and a generally thin profile or thickness, which allows for a higher degree of control of the heating and/or combustion of any precursor introduced to the flame. Also precursors introduced to a premixed flame experience short residence times, which allows for limited molecular size growth and narrow distributions of molecular or cluster size of the precursor material. High uniformity of the flame facilitates uniform treatment of any precursor introduced in to the flame.

A diffusion flame, by contrast, is a flame in which the oxidizer combines with the fuel by diffusion during combustion. As a result, the fuel burning rate is limited by the rate of diffusion. Diffusion flames burning hydrocarbons tend to produce soot because there may not be sufficient oxidizer for the reaction to go to completion, although there are some exceptions to the rule. Diffusion flames tend to have no localized flame front.

The differences between a diffusion flame and a stagnation flame are numerous, especially when applied to depositing materials. Stagnation flames are relatively thin and their positions are adjustable relative to the substrate. This results in significantly better control over the flame, and also over the molecular precursors or clusters of precursors that are formed by the flame. Unlike a diffusion flame, the substrate may be moved above a stagnation flame without significantly affecting the flame. Movement of the substrate advantageously allows the substrate to be kept cool by convection and allows deposition of material in a uniform manner and in a continuous process that can be readily combined with other processing steps. Furthermore, heterogeneous, surface reactions are not required to achieve a highly crystalline film with a stagnation flame.

Stagnation flames have been analyzed for flame velocity measurements and the mechanism for stabilizing such flames are known. See, e.g., Powling, Fuel, 1949, volume 28, pp. 25-28; Egerton, Proceedings of The Royal Society A, 1952, volume 211, pp. 445-471; Biedler et al., Jet Propulsion 1957, volume 27, pp. 1257-1260. Additional reference material regarding the properties and formation of premixed stagnation flames can be found in Law, Combustion Physics, Cambridge Press, 2006. However, it is believed that stagnation flames were not expected to be used to form conductive materials on substrates.

In practicing an aspect of the present disclosure, a stagnation flame is formed by the combustion (e.g., igniting and/or burning) of a premixed fuel and oxidant. Any combustible fuel and oxidant can be used to form the flame. For example, the fuel can be any combustible ingredient such as one or more hydrocarbons, which includes, without limitation, an alkane, e.g., methane, ethane, propanes, butanes, pentanes, hexanes, heptanes, octanes, etc, an alkene, such as ethylene, propylenes, butylenes, butadiene, etc., an alkyne, e.g., acetylene, propyne, etc, an aromatic hydrocarbon, e.g., benzene, toluene, xylene; a non hydrocarbon, such as, hydrogen, carbon monoxide etc. The oxidant can be any ingredient that oxidizes the fuel to form a stagnation flame and includes, without limitation, oxygen, air, etc.

The stagnation flame can be stabilized by a substrate to which conductive material is to be deposited or by another article holding the substrate. In one embodiment of the present disclosure, the flame is stabilized by a moving substrate or article. While it was understood that a stagnation flame could be formed against a stationary substrate, it was unexpectedly discovered that a stagnation flame could also be formed against a moving stabilizing surface, i.e., a surface of an article or substrate. Forming a stagnation flame with a mobile stabilizer surface advantageously allows a continuous manufacturing process. As used herein, the terms move, mobile, translating or other terms relating to the movement of the substrate or article used to stabilize the stagnation flame refers to the substrate or article that is moving relative to the flame to form a stagnation flame.

Any substrate can be used in forming a conductive material on the substrate by use of a stagnation flame. Useful substrates are not limited to any particular material or design so long as they can be used with a stagnation flame. Advantageously, the substrate does not need to be flat since the stagnation flame can conform to, within certain limits, the surface contour of the substrate. Preferably the substrate or surface thereof has a glass transition temperature that is high enough to withstand significant deformation during the formation of conducting material on the substrate. The temperature experienced by the substrate or surface thereof exposed to the stagnation flame will depend on the selection of such parameters as the fuel, oxidant, precursor, their respective feed rates, the rate of movement of the substrate against the flame, etc. In one aspect of the disclosure, the temperature of the substrate is maintained no higher than about 300° C., e.g. no higher than about 200° C., and preferably no higher than about 150° C., e.g., no higher than about 125° C. during the formation of conductive material thereon. Suitable substrates include those made of metals, such as iron-based metals, aluminum, etc.; ceramics; semiconductors, such as silicon or gallium-based materials; plastics, such as polyamides, polyesters, polycarbonates, polyimides, polysulfones, polyurethanes, polyacrylates, polyolefin based plastics, fluorinated polymers, polysaccharides, polyalkynes; etc. In one aspect of the present disclosure, the substrate is made of a transparent material. For example, transparent substrates can be used such as, without limitation, a polycarbonate, polyethylene terephthalate (PET), Teflon-PFA, SUPRADEL™ HTS, various other polysulfones, polyethersulfone, various types of glass, such as borosilicate glass, soda lime glass, quartz etc and other various types of transparent materials. In a preferred aspect of the present disclosure, the substrate includes a transparent material and has a glass transition temperature of above about 125° C.

Any precursor can be used in the present disclosure as long as the precursor is capable of forming a conductive material after passing through a stagnation flame either alone or with other precursors and/or one or more dopants. Preferably, the conductive material is one that produces a sheet resistance of less than one GOhms/square. The conductive materials of the present disclosure can have a sheet resistance of less than about one MOhms/square, e.g., no more than about 50 kOhms/square, and more preferably less than about 100 Ohms/square, e.g., less than about 10 Ohms/square. Precursors that can be used to form conducting materials through a stagnation flame include organometallic compounds, such as a metal alkyl, e.g., alkyl zinc, dimethylzinc, diethylzinc, trimethyl zinc, triethyl zinc, alkyl aluminum, trimethyl aluminum, triethylaluminum, alkyl tin, tetramethyltin, tetraethyltin, dibutyl tin, dimethyl tin, tin 2-ethylhexanoate, indium isopropoxide, indium acetate, etc., metal halides, such as tin trichloride, tin tetrachloride, dimethyl tin dichloride, metal oxides, metal hydrides, metal nitrides, metal amines, and inorganic compounds, rare-earth transition metal precursors such as gold, copper and silver based precursors, etc. Many precursors are commercially available, while others can be prepared through conventionally chemical preparations.

In one aspect of the present disclosure, a conducting material is deposited onto a substrate by introducing one or more precursors to a stagnation flame. The choice of precursor and the mass ratio of the precursors will determine the material deposited on the substrate. In one embodiment of the present disclosure, the precursor or precursors are chosen to form a transparent conducting oxide on the substrate. Suitable precursors include at least one TCO forming precursor, e.g., an aluminum, tin, zinc and/or indium based precursor. Additional TCO forming precursors can be used in the present disclosure as long as the precursor is capable of forming a transparent conductive oxide after passing through a stagnation flame either alone or in with other precursors and/or dopants. Transparent conductive oxides that can be formed on a substrate include, without limitation, tin oxide ($SnO_2$), indium tin oxide (ITO); zinc oxide (ZnO), aluminum-doped zinc oxide (AZO); indium molybdenum oxide (In—Mo—O); antimony tin oxide (ATO); ZnO doped with various other elements such as F, In, Ga, B, Si, Ge, Ti, Zr, Hf. Sc, Y etc.

Other precursors can be used in other aspects of the process that do not require the formation of a conductive material. These precursors can be used to form additional materials on the substrate such as an electron diffusion or antireflective layer, for example, in subsequent processes or can be used prior to or during the formation of the conductive material on the substrate. Non-conducting material forming precursors include, without limitation, titanium tetraisopropoxde, silanes, etc.

Given the guidance of the present disclosure, one skilled in the art can select the appropriate parameters to optimize the properties of the conductive material(s) formed on the substrate produced using a stagnation flame. For example, the properties of the conductive materials produced using a stagnation flame are influenced by several factors, including the selection of precursor(s), the precursor(s) concentration (which can be controlled by the precursor feed rate), the flame temperature (which can be controlled by composition of the premixed fuel-oxidizer mixture), and the precursor residence time (which can be controlled by the feed rate of the premixed fuel-oxidizer mixture). It is believed that the feed rate of the precursor(s) can affect the size of the materials exiting the flame. Further, the feed rate of combustible gases can affect the location of the stagnation flame relative to the substrate, the ratio of fuel to oxidant can affect flame temperature, and the speed or rate of movement of the substrate can affect the temperature of the substrate and to some extent the properties of the precursor material before it is deposited on the substrate.

The deposition of conductive materials through a stagnation flame can be optimized to form crystalline grains and in a variety of sizes and morphology in the deposited conducting material, which in turn affects the chemical, optical and electric properties of the deposited material. For example, a stagnation flame can produce particles composed of metals and/or metal oxides having a reproducible and narrow size distribution and high crystalline content. These properties facilitate forming materials having good catalytic and photocatalytic properties, while at the same time remaining chemically and thermally stable over a long period of time.

In an embodiment of the present disclosure, the stagnation flame is formed under open-air atmospheric conditions. Open air refers to the absence of an enclosure surrounding the process. Further, the flame is not subject to a vacuum or pressure but is produced under the atmospheric pressure available at the site of producing the flame. In another embodiment of the present disclosure, the stagnation flame is formed in an enclosed environment. The flame may be subject to a vacuum or pressure, and an oxidizing, reducing or inert gas environment. For example, the stagnation flame can be formed at a pressure of between about 1 torr and 10,000 torr, e.g., between 1 torr and 1500 torr.

In one aspect of the present disclosure, the conducting material formed on the substrate has a sheet resistance of less than about 100 Ohms/square, e.g., a sheet resistance of less than about 15 Ohms/square. By selection of the appropriate parameters, the conducting film can be deposited on the substrate at a rate of between about 0.01 microns per hour to about 1000 microns per hour. The deposition of conductive material on substrates can occur at a thickness of between 0.001 microns to about 1000 microns or more. In one aspect of the present disclosure, a TCO film is formed on a substrate having an average light transmission in the visible region of no less than about 50%, e.g., an average light transmission in the visible region of no less than 70% or 90%. Sheet resistance can be conventionally measured using a 4-point probe, and light transmittance may be measured using a conventional UV-vis absorption spectrometer.

FIG. 1 illustrates a burner set-up using a stagnation flame. As shown, flame 100 is not attached to burner 102. The nozzle on the burner is not limited to any particular design. For example, the nozzle on the burner can be a tube or slot or any geometry capable of allowing a flow of combustible gasses through the nozzle to form a stagnation flame. The shape of the nozzle influences the shape of the stagnation flame. For example, if the nozzle is rectangular or circular, the stagnation flame can be formed into a sheet having a rectangular or circular geometry. Stagnation flame 100 is a free standing flame that exists because of flow divergence, shown as diverging flow stream 104, which allows the axial flow velocity to reach the flame speed of the premixed fuel-oxidizer mixture on a particular plane perpendicular to the flow, where the flame can be established. The position of the flame relative to substrate 106 can be adjusted by changing flow rate 108 of fuel-oxidizer mixture 110 through the burner. In this example the precursor is carried to the flame with the fuel-oxidizer mixture. Coannular sheath flow 112, made of an inert gas 114, e.g., nitrogen or argon, may be ejected to shield the combustible and combusting gas from the surrounding air and keep the flow field uniform.

FIG. 1 also illustrates that by keeping the burner stationery, the stabilizing surface 116, when it is part of moving substrate 106, may be cooled convectively because of its movement relative to the ambient air above the substrate. At a speed of about 4 m/s and a gas temperature of 2000° C. in the flame sheet, the temperature of the substrate can be usually maintained as low as 125° C. This advantageously allows for the use of substrates having low glass transition temperatures on which conductive material can be deposited. These low-temperature substrates include transparent polymer films with glass transition temperature above 125° C., e.g., polycarbonate and Teflon-PFA, and nonpolymer materials, e.g., glass. Even substrates having lower glass transition temperatures may be used by increasing the substrate moving speed and/or by lowering the temperature of the flame or the distance of the flame against the substrate.

In one embodiment of the present disclosure, FIG. 2 illustrates apparatus 200 designed to produce round stagnation flame 202 against moving stabilizer surface 204. The stabilizer surface can be the substrate onto which conducting material is deposited or it can be a moving surface holding a substrate. In this embodiment, stabilizer plate 204 holds substrate 206. As shown in FIG. 2, a fuel 208, oxidant 210 and an inert gas 212 is mixed in a flow mixer 214 and introduced to tubular burner 216. The inert gas can be any gas that does not interfere with the combustion of the fuel, as for example, nitrogen or argon. The premixed combustible fuel is ignited to form stagnant, unattached flame 202. Precursor 218, in this example, the precursor is a liquid, is introduced to the flame through mixer 214, in which it vaporizes and mixed with the fuel-oxidizer-inert gas. Liquid pump 220 can be used to control the amount of precursor 218 introduced to the flame.

In another embodiment of the present disclosure, FIG. 3 illustrates apparatus 300 designed to produce a rectangular stagnation flame 302 against moving stabilizer surface 304. The stabilizer surface can be the substrate onto which conducting material is deposited or it can be a conveyor belt or rotating drum holding a substrate. In this example substrate 306 is attached to sheet 304 and both substrate 306 and sheet 304 are moved over the flame which is stabilized against substrate 306. The benefits of a rectangular flame include the ability to increase the length of the stagnation flame sheet (for example, greater than 1 meter), while keeping the width of the flame sheet constant. This allows the coating of much larger substrates, without altering the flame structure and stability. As shown in FIG. 3, a premixed fuel-oxidant-inert mixture 308 is introduced into center slot 310 of the multi-injection slot burner 312. Precursor 314 is carried in to the burner through slots 316A and 316B. Another flow of fuel-oxidant-inert mixture 318 can be introduced into the burner 312 and ejected through slots 320A and 320B. The precursor may thus be carried to the flame by an inert gas, and kept separated from the fuel and oxidant until it is ejected from the slots. This allows for better control over the precursor delivery and is advantageous when one or more of the precursors can react with the fuel or oxidant. In this case, the precursor flow is sandwiched between two fuel-oxidant flows in order to ensure that all of the precursor passes through the flame. A sheath flow 322, made of an inert gas, is introduced and ejected through slots 324A and 324B. The precursor and the fuel-oxidizer-inert flows are mixed as they flow out of the slot burner. The premixed combustible fuel is ignited to form a stagnant, unattached flame 302.

In one aspect of the present disclosure, a burner having a multi-injection slot nozzle can be used to form the premixed stagnation flame, as shown in FIG. 3 for apparatus 300. A side view of the multi-injection slot nozzle is also shown in FIG. 4.

FIG. 5 is a schematic illustration of a burner set up using a plurality of burners that can be used to form one or more conducting materials and additional materials on a substrate.

Each burner can be configured to combust one or more premixed fuels and oxidants to form more than one stagnation flames against a moving article or substrate to stabilize the more than one stagnation flames. In this example, burner 502 is an aerodynamically shaped slot but any one or multiple burner configuration can be used. For example, a stagnation flame can be formed through a suitably shaped burner, such as an aerodynamic nozzle, tubular or slot burner. Each burner is used to form a stagnation flame (not shown for illustrative convenience) which can be stabilized by an article holding a substrate or the substrate itself. In this example, the substrate stabilizes the plurality of stagnation flames and is in the form of a long sheet 504, although other article and substrate forms can be used depending on the positioning of the burners, e.g., a disc can be used with multiple burners arranged in a circle. The substrate can be made of any material including a transparent material, e.g., a transparent glass or plastic material. As shown in FIG. 5, substrate 504 is moved over the burners by rotating drums 506 depending on the speed of the substrate over the burners and other factors, the drums can be cool, which can be done by air or other means. Inset 508 shows three drums directly over three burners with the substrate therebetween. While it may be advantageous to have the drums more or less directly over the burners, as for example, to aid in cooling the substrate, the drums need not be so positioned. Some or no drums may be over the burners.

The arrangement in FIG. 5 provides several advantages. By using a plurality of burners, the substrate temperature can be maintained at a lower temperature by moving the substrate against the multiple flames at a faster rate that it would need to pass against a single burner to maintain the same rate of deposition of conductive material on the substrate. Use of multiple burners also permits faster deposition of conductive materials on the substrate. Moreover, by using a plurality of burners, each burner and stagnation flame can be individually configured to deposit conductive materials or non-conductive materials on to the moving substrate. Each burner can be individually configured to produce any stagnation flame and to produce either the same or different materials (either conducting or non-conducting) on the moving substrate.

In an embodiment of the present disclosure, a transparent conducting oxide (TCO), such as AZO or ITO, can be formed on a transparent substrate by a stagnation flame. The TCO can be formed as a thin film deposited by intermittently, but continuously moving the substrate against the flame. Preferably the substrate is made of a material capable of withstanding significant deformation at temperature not in excess of about 200° C., e.g., no in excess of about 125° C. The flame can be established by a flow of combustible gases (e.g., a mixture of ethylene, oxygen and argon) through an aerodynamic nozzle or slot burner and stabilized into a thin sheet by flame stretch below a mobile stabilizer surface. Film deposition is accomplished by introducing suitable TCO forming precursors to the flame to form a TCO film. Examples of suitable precursors include zinc and aluminum precursors to produce an AZO film and suitable indium and tin precursors to produce an ITO film. Film deposition is believed to be driven by flow impingement and diffusion of metals and metal oxide vapor and thermophoresis of metal oxide clusters or nanoparticles from the flame sheet to the translating surface.

EXAMPLES

The following examples are intended to further illustrate certain preferred embodiments of the invention and are not limiting in nature. Those skilled in the art will recognize, or be able to ascertain, using no more than routine experimentation, numerous equivalents to the specific substances and procedures described herein.

The burner assembly, as shown schematically in FIG. 2, uses an aerodynamically shaped nozzle with a 1 cm exit diameter to generate a stagnation flame against a titanium disc 12 inch diameter, placed 3.4 cm from the nozzle exit. All tests are done at atmospheric air pressure.

A laminar jet of an unburned mixture (e.g., an unburned mixture of about 5.1% of ethylene ($C_2H_4$), about 15.7% oxygen ($O_2$) and the balance argon (Ar)) is issued at a cold-gas velocity of 229 cm/s (STP). The flame is stabilized about 0.3 cm below the disc. The gas jet and the flame are isolated by a shroud of argon issued through a concentric tube. Unburned gases were metered individually with mass flow controllers (Omega FMA 1700-1800) and mixed before flowing into the burner nozzle.

15% (wt) diethyl zinc in hexane (Alfa-Aesar Item #89038) and 25% (wt) triethylaluminum in hexane (Alfa-Aesar Item #89054) are mixed in a 95% (vol) to 5% (vol) proportion. The liquid mixture is injected at 3 ml/hr into the unburned mixture through a hypodermic needle by a syringe pump (Genie Plus, Kent Scientific). To prevent the precursor from condensing in the line, the entire gas lines and the burner are heated to 70° C. Under this condition the partial pressure of diethylzinc and triethylaluminum is substantially smaller than its saturation pressure.

The substrate, a titanium disc, was mounted on a precision stepper motor (Aerotech BM250_UF), capable of reaching a desired position with an accuracy of 1 arc second. The motor speed was between 100 to 600 RPM and controlled by a BAI Intellidrive controller. The center-to-center distance between the motor axis and the gas jet is 12.1 cm. A series of flat slots were machined on the titanium disc allowing the mounting of several particle film deposition substrates. As the cooled disc rotates, the substrates are repetitively inserted over the flame and at each pass, zinc oxide and aluminum oxide vapor, clusters, or nanoparticles are deposited onto the substrates.

Typical operating conditions for forming an AZO film on a precleaned glass substrate, using a round jet, premixed stagnation flame (as shown schematically in FIG. 2) with a jet exit diameter of 1 cm is provided in the table below. The moving stabilizer surface is a ¼ inch thick, rotating titanium disc. Glass or other substrate may be mounted under the disc. The unburned premixed gas contains 5.1% $C_2H_4$-15.7% $O_2$—Ar and with a volumetric flow rate of 10.79 L/min. Precursors are 15% (wt) diethylzinc in hexane and 25% (wt) triethylaluminum in hexane, mixed in a 95% (vol) to 5% (vol) proportion. The substrate temperature was about 120° C.

| Precursor injection rate (ml/hr) | Disc speed (RPM) | Deposition time per insertion (ms) | Total deposition time (min) | Surface resistance (kOhm/sq) | Other conditions |
|---|---|---|---|---|---|
| 3 | 150 | 15 | 4.5 | 5 | burner and gas line temperature = 70° C. |
| 3 | 75 | 30 | 1.5 | 50 | burner and gas line temperature = 70° C. |

In an aspect of the present disclosure, the deposited conducting material on the substrate is further formed as a pattern of conducting material and non-conducting material. The patterning of the conducting material can be formed by depositing a layer of TCO prior to depositing a layer of non-conducting material. In an embodiment of the present disclosure, the patterned conducting material is a layer of transparent conducting oxide, such as AZO or ITO and a film of semi-conducting material, such as titanium oxide or titanium oxide nanoparticles.

Optoelectronic Device/Solar Cell

The conducting material on a substrate described herein can be used for a variety of optoelectronic devices. For example, the substrate with the conducting material thereon can be used as a transparent, conducting film for liquid crystal displays, flat panel displays, plasma displays, touch panels, light-emitting diodes, antistatic coatings, radio frequency and electromagnetic interference shieldings, by substituting a substrate having a transparent conducting oxide that is typically used in such devices with a substrate having conducting material produced by a premixed stagnation flame.

In an embodiment of the present disclosure, a solar cell is assembled including, without limitation, a TCO film formed on any suitable transparent substrate and a nanocrystalline semiconductor film. The TCO film, such as an AZO or ITO film, can be formed with a stagnation flame and can be deposited on any suitable transparent substrate, such as a transparent glass or a transparent plastic film, e.g., a plastic polycarbonate film. The nanocrystal can also be formed using the premixed stagnation flame described above by introducing an appropriate precursor, such as titanium tetraisopropoxide.

In this disclosure there is shown and described only the preferred embodiments of the invention and but a few examples of its versatility. It is to be understood that the invention is capable of use in various other combinations and environments and is capable of changes or modifications within the scope of the inventive concept as expressed herein. For example, while a preferred embodiment has been described as applicable to deposition of various thin crystalline films, the processes disclosed herein are applicable to the deposition of other forms of conductive materials with minor modifications that would be within the skill of the practitioner.

Only the preferred embodiment of the present invention and examples of its versatility are shown and described in the present disclosure. It is to be understood that the present invention is capable of use in various other combinations and environments and is capable of changes or modifications within the scope of the inventive concept as expressed herein. Thus, for example, those skilled in the art will recognize, or be able to ascertain, using no more than routine experimentation, numerous equivalents to the specific substances, procedures and arrangements described herein. Such equivalents are considered to be within the scope of this invention, and are covered by the following claims.

What is claimed is:

1. A process of forming an electrically conductive film on a substrate, the process comprising:
    combusting a premixed fuel and oxidant to form a stagnation flame against a moving surface to stabilize the stagnation flame, wherein the moving surface is either the surface of the substrate or the moving surface holds the substrate and wherein the stagnation flame is a free standing, unattached flame; and
    introducing at least one precursor to the flame to form an electrically conducting film onto the substrate; wherein the conductive film has a sheet resistance of less than one GOhms/square.

2. The process of claim 1 wherein the at least one precursor is at least one metal oxide precursor that is introduced to the flame to form the conducting film.

3. The process of claim 1 wherein the at least one precursor is selected from the group consisting of one or more of rare-earth transition metal precursors.

4. The process of claim 1, wherein the premixed fuel and oxidant is directed through a burner having more than one nozzle and the precursor is introduced to the flame by directing the precursor through a different nozzle of the burner.

5. The process of claim 1, wherein the moving surface holds the substrate which allows the substrate to repeatedly move over the flame to deposit the conducting film on the substrate.

6. The process of claim 5, wherein the moving surface is the surface of a rotating drum, a rotating plate, or a rotating conveyor belt.

7. The process of claim 1, further comprising depositing an additional material over the conductive film on the substrate.

8. The process of claim 1, wherein the stagnation flame is formed at a pressure of between 1 Torr and 1,500 Torr.

9. The process of claim 1, further comprising combusting a premixed fuel and oxidant to form more than one stagnation flames against the moving surface to stabilize the more than one stagnation flames, wherein each stagnation flame is a free standing, unattached flame.

10. A process of forming a transparent conducting oxide (TCO) film on a substrate, the process comprising:
    combusting a premixed fuel and oxidant to form a stagnation flame against a moving surface to stabilize the stagnation flame, wherein the moving surface is either the surface of the substrate or the moving surface holds the substrate and wherein the stagnation flame is a free standing, unattached flame; and
    introducing at least one TCO forming precursor to the flame to form the TCO film on the substrate; wherein the TCO film is electrically conductive with a sheet resistance of less than one GOhms/square and the TCO film has an average light transmission in the visible region of no less than 50%.

11. The process of claim 10, wherein the surface temperature of the substrate is no higher than about 125° C.

12. The process of claim 10, wherein the at least one TCO forming precursor is selected from the group consisting of an aluminum based precursor and a tin based precursor.

13. The process of claim 10, wherein the at least one TCO forming precursor is selected from the group consisting of an alkyl zinc and alkyl aluminum and the TCO film comprises an aluminum doped zinc oxide.

14. The process of claim 10, wherein the at least one TCO forming precursor is selected from the group consisting of an indium based precursor and a tin based precursor and the TCO film comprises an indium tin oxide.

15. The process of claim 10, wherein the substrate is a transparent polymer film.

16. The process of claim 10, wherein the TCO is formed on the substrate as a film having a thickness of between about 0.001 microns to about 1000 microns.

17. The process of claim 10, wherein the TCO film has a sheet resistance no higher than 50 kOhm/sq.

18. The process of claim 10 wherein the TCO film has an average light transmission in the visible region of no less than 70%.

19. The process of claim 10 wherein the TCO film is deposited on the substrate at a rate of between about 0.01 microns per hour to about 1000 microns per hour.

20. A process of forming an electrically conductive film on a substrate, the process comprising:

combusting a premixed fuel and oxidant to form a stagnation flame against a moving substrate to stabilize the stagnation flame, wherein the stagnation flame is a free standing, unattached flame having a rectangular geometry; and introducing at least one precursor through the flame to form an electrically conducting film onto the substrate; wherein the conductive film has a sheet resistance of less than one GOhms/square.

* * * * *